(12) United States Patent
Granados et al.

(10) Patent No.: US 7,989,968 B2
(45) Date of Patent: Aug. 2, 2011

(54) METHOD AND APPARATUS FOR MEASUREMENT AND CONTROL OF PHOTOMASK TO SUBSTRATE ALIGNMENT

(75) Inventors: Axel A. Granados, Rochester, MN (US); Benjamin A. Fox, Rochester, MN (US); Nathaniel J. Gibbs, Rochester, MN (US); Andrew B. Maki, Rochester, MN (US); Trevor J. Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/888,697

(22) Filed: Sep. 23, 2010

(65) Prior Publication Data

US 2011/0013187 A1  Jan. 20, 2011

Related U.S. Application Data

(62) Division of application No. 11/861,380, filed on Sep. 26, 2007, now Pat. No. 7,875,987.

(51) Int. Cl.
*H01L 23/544* (2006.01)
(52) U.S. Cl. ............ 257/797; 257/E31.122; 257/114; 356/509; 438/8; 438/975
(58) Field of Classification Search .............. 257/114, 257/797, E31.122; 365/509; 438/8, 975
See application file for complete search history.

(56) References Cited

U.S. PATENT DOCUMENTS

| 6,297,876 | B1 | 10/2001 | Bornebroek |
| 7,050,148 | B2 | 5/2006 | Shiraishi |
| 2003/0147082 | A1 | 8/2003 | Goldstein |
| 2005/0225629 | A1 | 10/2005 | Kubota et al. |
| 2005/0275814 | A1 | 12/2005 | Eib et al. |
| 2008/0205820 | A1 | 8/2008 | Zheng et al. |

FOREIGN PATENT DOCUMENTS

| CN | 101114134 A | 1/2008 |
| EP | 0445871 A1 | 9/1991 |
| EP | 1677158 A2 | 7/2006 |
| JP | 04303914 A | 10/1992 |

OTHER PUBLICATIONS

Notice of Allowance (Mail Date Sep. 16, 2010) for U.S. Appl. No. 11/861,380, filed Sep. 26, 2007; Confirmation No. 8301.
U.S. Appl. No. 12/888,600, filed Sep. 23, 2010.

*Primary Examiner* — Thanh V Pham
(74) *Attorney, Agent, or Firm* — Schmeiser, Olsen & Watts

(57) ABSTRACT

A method, structure, system of aligning a substrate to a photomask. The method comprising: directing light through a clear region of the photomask in a photolithography tool, through a lens of the tool and onto a set of at least three diffraction mirror arrays on the substrate, each diffraction mirror array of the set of at least three diffraction mirror arrays comprising a single row of mirrors, all mirrors in any particular diffraction mirror array spaced apart a same distance, mirrors in different diffraction mirror arrays spaced apart different distances; measuring an intensity of light diffracted from the set of at least three diffraction mirror arrays onto an array of photo detectors; and adjusting a temperature of the photomask or photomask and lens based on the measured intensity of light.

7 Claims, 10 Drawing Sheets

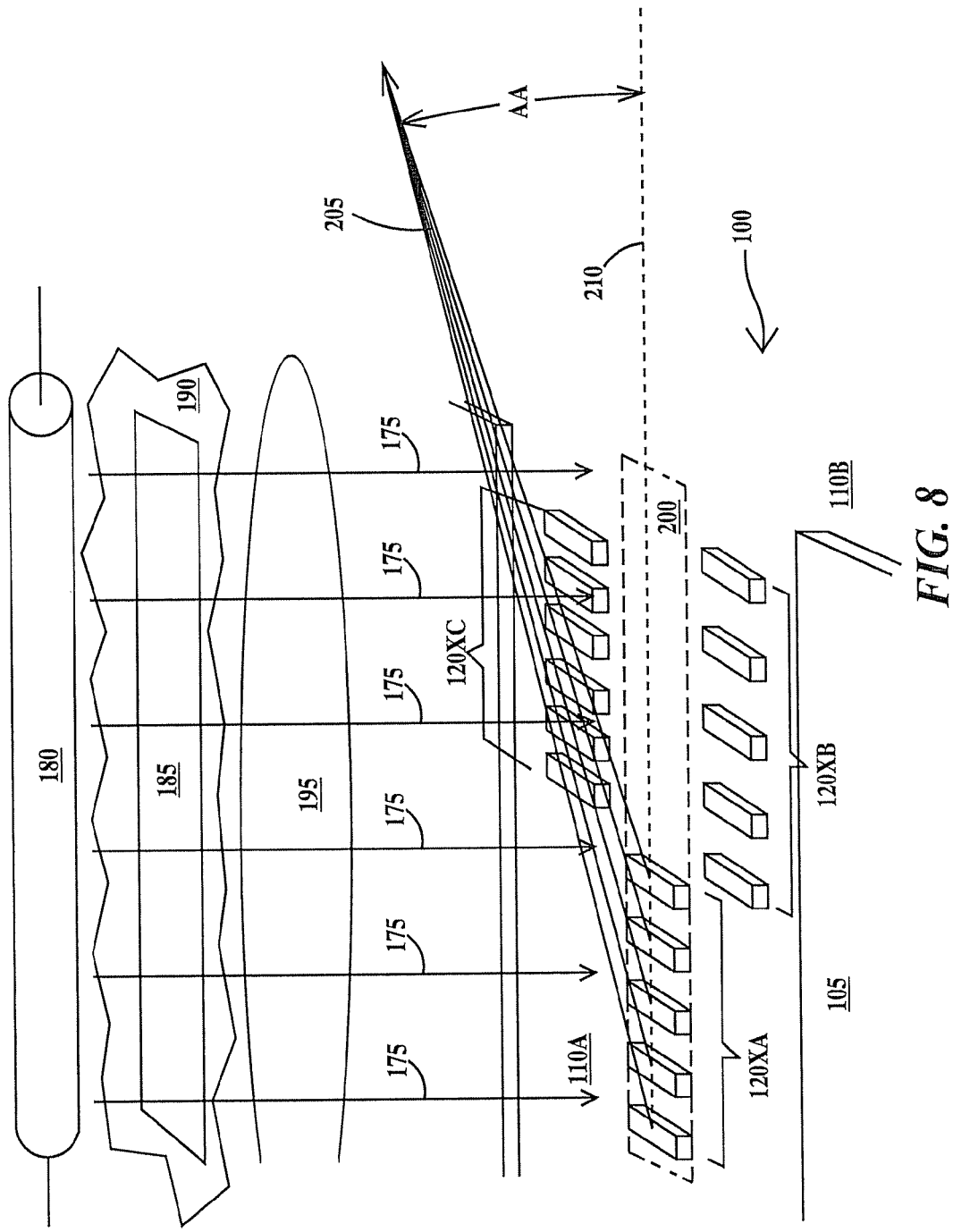

METHOD AND APPARATUS FOR MEASUREMENT AND CONTROL OF PHOTOMASK TO SUBSTRATE ALIGNMENT

This application is a division of U.S. patent application Ser. No. 11/861,380 filed on Sep. 26, 2007.

FIELD OF THE INVENTION

The present invention relates to the field of optical photolithography; more specifically, it relates to a structure and method for determining and adjusting photomask and lens to wafer alignment in an optical photolithographic system.

BACKGROUND OF THE INVENTION

Current optical photolithographic techniques are unable to use light with a wavelength below 193 nm because fused silica (silicon dioxide) of conventional mask substrates is opaque to wavelengths below 193 nm. Substrate materials that are transparent to light with a wavelength below 193 nm have high thermal coefficients of expansion compared to silicon dioxide and thus expand and contract far too much to be used reliably in sub-193 nm lithography. Because the minimum feature size printable in an optical photolithographic system is a function of the wavelength of the actinic radiation (shorter wavelengths allowing smaller feature sizes) it would be useful to the industry to overcome the deficiencies and limitations described hereinabove.

SUMMARY OF THE INVENTION

A first aspect of the present invention is a method; comprising: directing light through a clear region of a photomask, through a lens and onto a set of at least three diffraction mirror arrays on a substrate, each diffraction mirror array of the set of at least three diffraction mirror arrays comprising a single row of mirrors, all mirrors in any particular diffraction mirror array spaced apart a same distance, mirrors in different diffraction mirror arrays spaced apart different distances; measuring an intensity of light diffracted from the set of at least three diffraction mirror arrays onto an array of photo detectors; and adjusting alignment of the photomask to the substrate based on the measured intensity of light.

A second aspect of the present invention is a method comprising: etching away a region of a substrate to leave a set of at least three diffraction mirror arrays, each diffraction mirror array of the set of at least three diffraction mirror arrays comprising a single row of mirrors raised above a surface of the region, all mirrors in any particular diffraction mirror array spaced apart a same distance, mirrors in different diffraction mirror arrays spaced apart different distances, every mirror having a top surface coplanar with a top surface of the substrate and every mirror having sidewalls, the rows of mirrors of the diffraction mirror arrays of the set of at least three diffraction mirror arrays having parallel longitudinal axes in a plane parallel to the top surface of the substrate.

A third aspect of the present invention is a structure, comprising: a recessed region of a substrate, the substrate having a top surface; a first row of first mirrors, the first row of first mirrors extending from an initial first mirror to a last first mirror along a first longitudinal axis in a first direction, each first mirror of the first row of first mirrors having a first width measured in the first direction and a first length measured in a second direction, the first direction perpendicular to the second direction, the first mirrors spaced apart a first distance in the first direction; a second row of second mirrors, the second row of second mirrors extending from an initial second mirror to a last second mirror along a second longitudinal axis in the first direction, each second mirror of the second row of second mirrors having a second width measured in the first direction and a second length measured in the second direction, the second mirrors spaced apart a second distance in the first direction; a third row of third mirrors, the third row of third mirrors extending from an initial third mirror to a last third mirror along a third longitudinal axis in the first direction, each third mirror of the third row of third mirrors having a third width measured in the first direction and a third length measured in the second direction, the third mirrors spaced apart a third distance in the first direction; the first, second and third longitudinal axes in a plane parallel to the top surface of the substrate, the first, second and third longitudinal axes parallel to each other, the first, second and third longitudinal axes offset from each other in the first direction, the first longitudinal axis between the second and third longitudinal axes; and the first distance less than the third distance, the third distance greater than the second distance.

A fourth aspect of the present invention is a system for aligning a semiconductor substrate to a photomask, comprising: an X-Y-θ stage configured to hold the semiconductor substrate; a light source; a lens; a mask holder configured to hold the photomask between the light source and lens; means for aligning alignment targets on the substrate to alignment marks on the photomask; an array of photo detectors positioned to measure intensities of light diffracted at least three different angles from diffraction mirrors on the substrate; and means for adjusting alignment of the alignment targets on the photomask to the alignment targets on the photomask the substrate based on the intensities of light.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 8 is an isometric view of the operation of alignment monitor structures according to the embodiments of the present invention when the photomask and wafer are aligned;

DETAILED DESCRIPTION OF THE INVENTION

Figure 1:
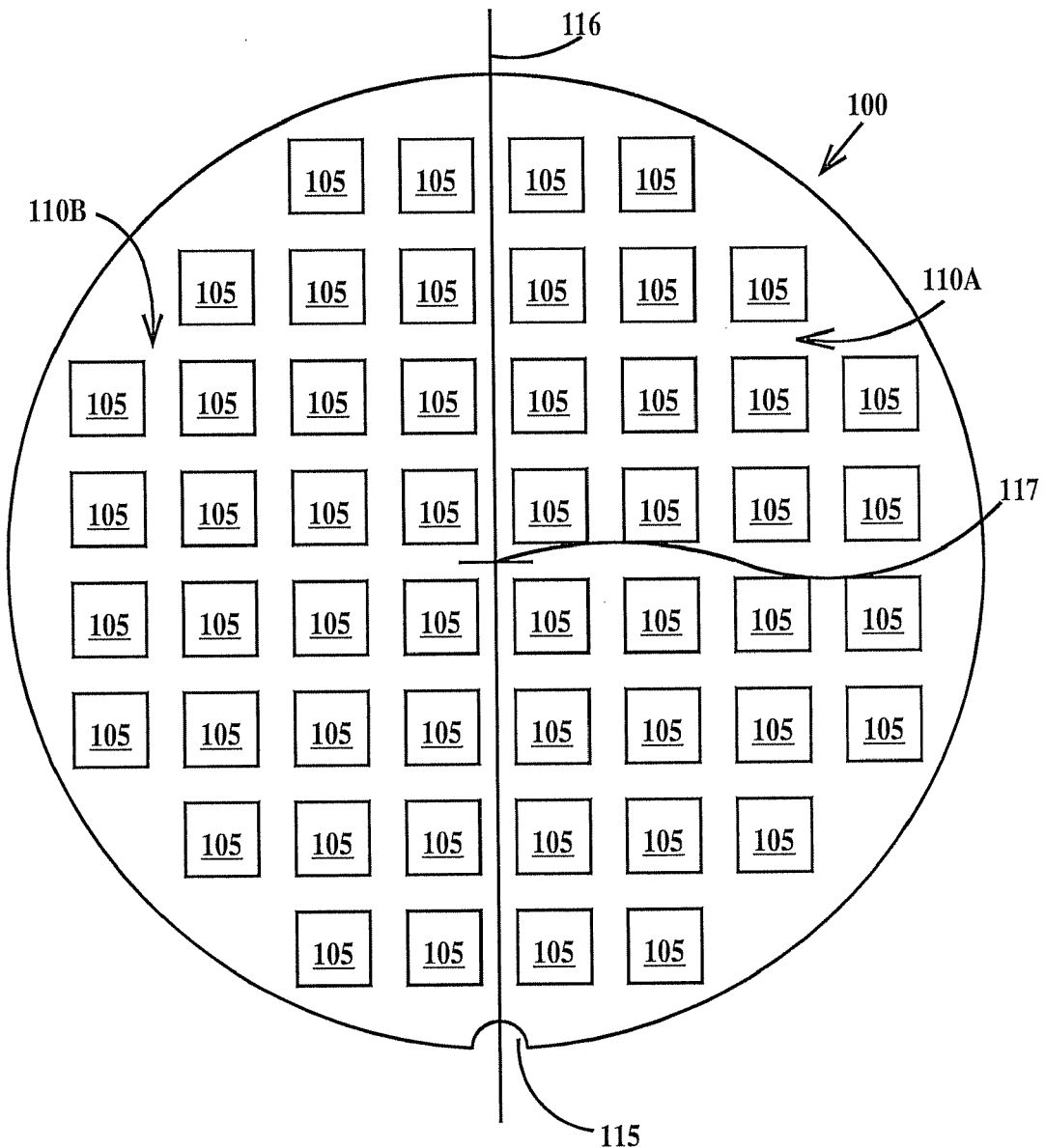
FIG. 1 is a top view of an exemplary integrated circuit wafer on which the embodiments of the present invention may be practiced.

FIG. 1 is a top view of an exemplary integrated circuit wafer on which the embodiments of the present invention may be practiced. It is common practice to fabricate multiple integrated circuit chips simultaneously on thin, disc shaped semiconductor substrates called wafers. Common wafer diameters are 100 mm, 200 mm and 300 mm with thicknesses in the hundreds of micron range. In one example, wafers consist of single-crystal silicon. In one example, wafers comprise an upper single crystal silicon layer separated from a lower single-crystal silicon layer by a buried oxide (BOX) layer. These latter wafers are also called silicon-on-insulator (SOI) wafers. After fabrication of the integrated circuit chips is complete, the individual chips are separated in an operation called dicing. In FIG. 1, a wafer 100 includes an array of integrated circuit chips 105 separated by horizontal (X-direction) kerfs 110A and vertical (Y-direction) kerfs 110B. Wafer 100 includes a notch 115 for orientating the wafer in various fabrication tools. There may be several notches. In FIG. 1, a line 116 running from notch 115 through a center 117 of wafer 100 defines the vertical or Y-direction. The horizontal or X-direction is perpendicular to line 116 and in the same plane as line 116. Kerfs 110A and 110B are also called streets.

Figure 2:
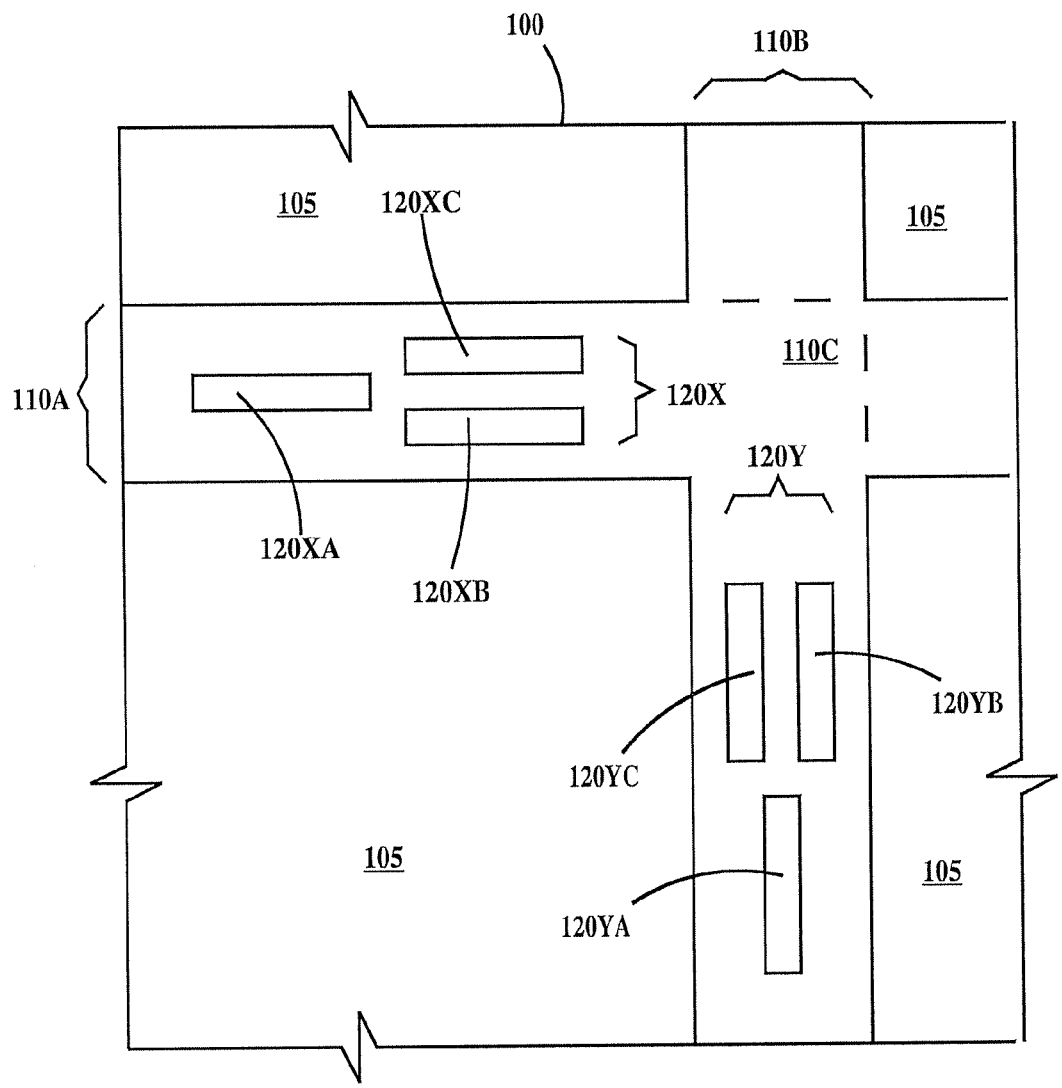
FIG. 2 is a higher magnification view of the wafer of FIG. 1, illustrating positioning of alignment monitor structures according to the embodiments of the present invention.

FIG. 2 is a higher magnification view of the wafer of FIG. 1, illustrating positioning of alignment monitor structures according to the embodiments of the present invention. In FIG. 2, only a portion of wafer 100 is illustrated. In FIG. 2, formed in kerf 110A is a first set of diffraction mirror arrays 120X comprised of a first diffraction mirror array 120XA, a second diffraction mirror array 120XB and a third diffraction mirror array 120XC. Formed in kerf 110B is a second set of diffraction mirror arrays 120Y comprised of a first diffraction mirror array 120YA, a second diffraction mirror array 120YB and a third diffraction mirror array 120YC. The intersection of kerfs 110A and 110B is designated corner 110C.

First set of diffraction mirror arrays 120X will detect shifts in alignment between a photomask and wafer 100 in the Y direction. Second diffraction mirror array 120XB will detect shifts in the +Y direction and third diffraction mirror array 120XC will detect shifts in the −Y direction. Second set of diffraction mirror arrays 120Y will detect shifts in alignment between a photomask and wafer 100 in the X-direction. Second diffraction mirror array 120YB will detect shifts in the +X-direction and third diffraction mirror array 120YC will detect shifts in the −X-direction.

Most modern photolithographic systems are step and expose or step and scan systems, in that the photomask used in the system has patterns for less integrated circuit chips than the number that can printed on wafer 100. These photomasks are often called reticles. Exemplary reticles may contain one, two, four or other numbers of chip exposure fields, each chip exposure field containing a chip 105, one kerf 110A, one kerf 110B and one corner 110C. To expose an entire wafer, the wafer is aligned to the mask and exposed, then the wafer is stepped to another position, aligned to the mask and then and exposed. This is repeated as many times a required to expose all the integrated circuit chip positions on the wafer. There need only be one instance of sets of diffraction mirrors for each region of wafer 100 that is defined by the reticle.

Figure 3:
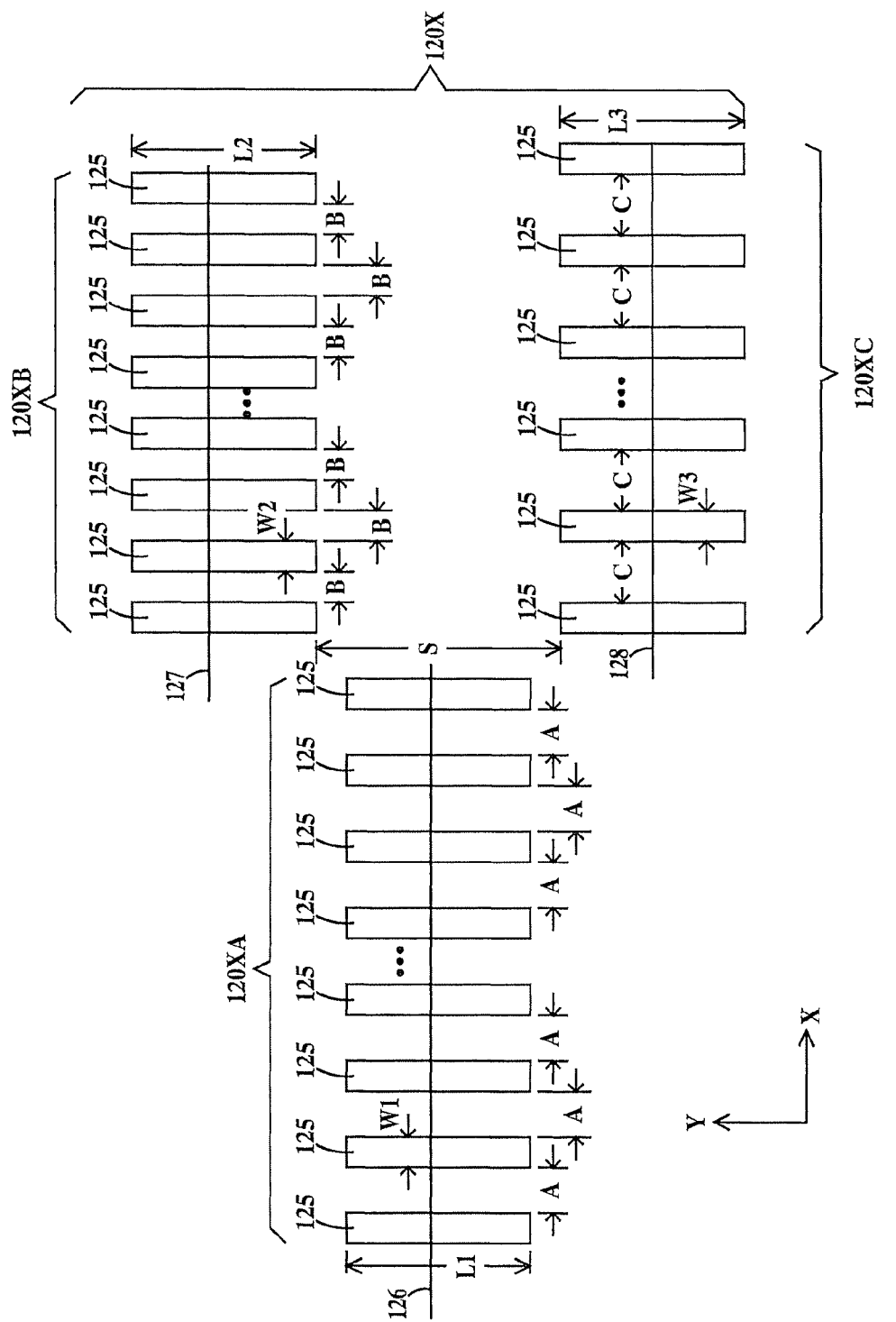
FIG. 3 is a top view of alignment structures according to a first embodiment of the present invention.

FIG. 3 is a top view of alignment structures according to a first embodiment of the present invention. In FIG. 3, only first set of diffraction mirror arrays 120X is illustrated and described, but second set of diffraction mirror arrays 120Y (not shown) is similar except rotated 90° counterclockwise. First diffraction mirror array 120XA is comprised of N (or N1) mirrors 125 in a single row extending along the X-direction. Each diffraction mirror of first diffraction mirror array 120XA has a width W1 measured in the X-direction, a length L1 measured in the Y direction and are spaced apart a distance A. Second diffraction mirror array 120XB is comprised of M times N (or M1 times N2) mirrors 125 in a single row extending along the X-direction. Each diffraction mirror of second diffraction mirror array 120XB has width W2, length L2 and are spaced apart a distance B. Third diffraction mirror array 120XA is comprised of M times N (or M2 times N3) mirrors 125 in a single row extending along the X-direction. M and N (and N1, N2, N3, M1 and M2) are positive integers. Each diffraction mirror of third diffraction mirror array 120XC has width W3, length L3 and are spaced apart a distance C. (A+W1), (B+W2), and (C+W3) may be considered equivalent to the groove periodicity of a diffraction grating and the space between adjacent mirrors of the same diffraction mirror array may be considered grooves. For exemplary purposes, A is greater than B and less than C. The combination C>A>B has the advantage of simplifying instrumentation of a photolithography system configured to use the embodiments of the present invention (see FIGS. 10 and 11 and description infra). However, any other combinations may be used, as long as A, B and C are different. For example, the combinations A>B>C and A>C>B use less kerf area because the A spaced array has the least number of mirrors. L1, L2 and L3 may all be the same or different. W1, W2 and W3 may be all the same or different. Minimum feature size for W1, W2 and W3 is optimal for a more focused diffracted light.

The longitudinal axes 126, 127 and 128 (in the X-direction) respectively of first, second and third diffraction mirror arrays 120XA, 120XB and 120XC are arranged parallel to one another. Second and third diffraction mirror arrays are spaced apart a distance S in the Y-direction, where S is slightly greater than L1. The closer S and L1 are to each other, the sooner a misalignment will be sensed and corrected. Longitudinal axis 126 of first diffraction array 120XA is aligned midway between the longitudinal axes of second and third diffraction mirror arrays 120XB and 120XC. No mirror of first diffraction mirror array 120XA interposes between second and third diffraction mirror arrays 120XB and 120XC.

In one example N is between about 500 and about 2000 and M is between about 50 and about 200. In one example, N1, N2 and N3 are independently between about 500 and about 2000 and M1 and M2 are independently between about 50 and about 200. In one example (A+W1), (B+W2) and (C+W3) are between about 150 nm and about 300 nm. In one example W1=W2=W3 and is the minimum dimensional definable by the combination of the photolithographic system, photomask, and wavelength of light used to expose wafer 100 and L1=L2=L3 and is about 5 to 10 times W1. The smaller W1, W2 and W3, the more focused the diffracted light beams will be. The larger L1, L2 and L3, the more intense the diffracted light beams will be. In an exemplary first set of diffraction mirror arrays 120X, A+W1 is about 175 nm, C+W3 is about 200 nm, B+W2 is about 150 nm, N is about 1000 and M is about 100, W1=W2=W3 and is the minimum definable dimension and L1=L2=L3 is about 5 times W1=W2=W3.

While it is not necessary that second set of diffraction mirror arrays 120Y (not shown) be identical (except for orientation of the longitudinal axes) to first set of diffraction mirror arrays 120X, it is advantageous that they be similar in order to simplify mask fabrication and exposure system controls. Any of the values of A, B, C, D, W1, W2, W3, L1, L2, L3, N, N1, N2, N3, M, M1 and M2 of second set of diffraction mirror arrays 120Y can be independently the same or different from the values of A, B, C, D, W1, W2, W3, L1, L2, L3, N, N1, N2, N3, M, M1 and M2 of first set of diffraction mirror arrays 120X. As is discussed infra, first and second sets of diffraction mirror arrays 120XB and 120XC will allow determination of Y misalignment and diffraction mirror arrays 120YB and 120YC will allow determination of X misalignment.

Figure 4:
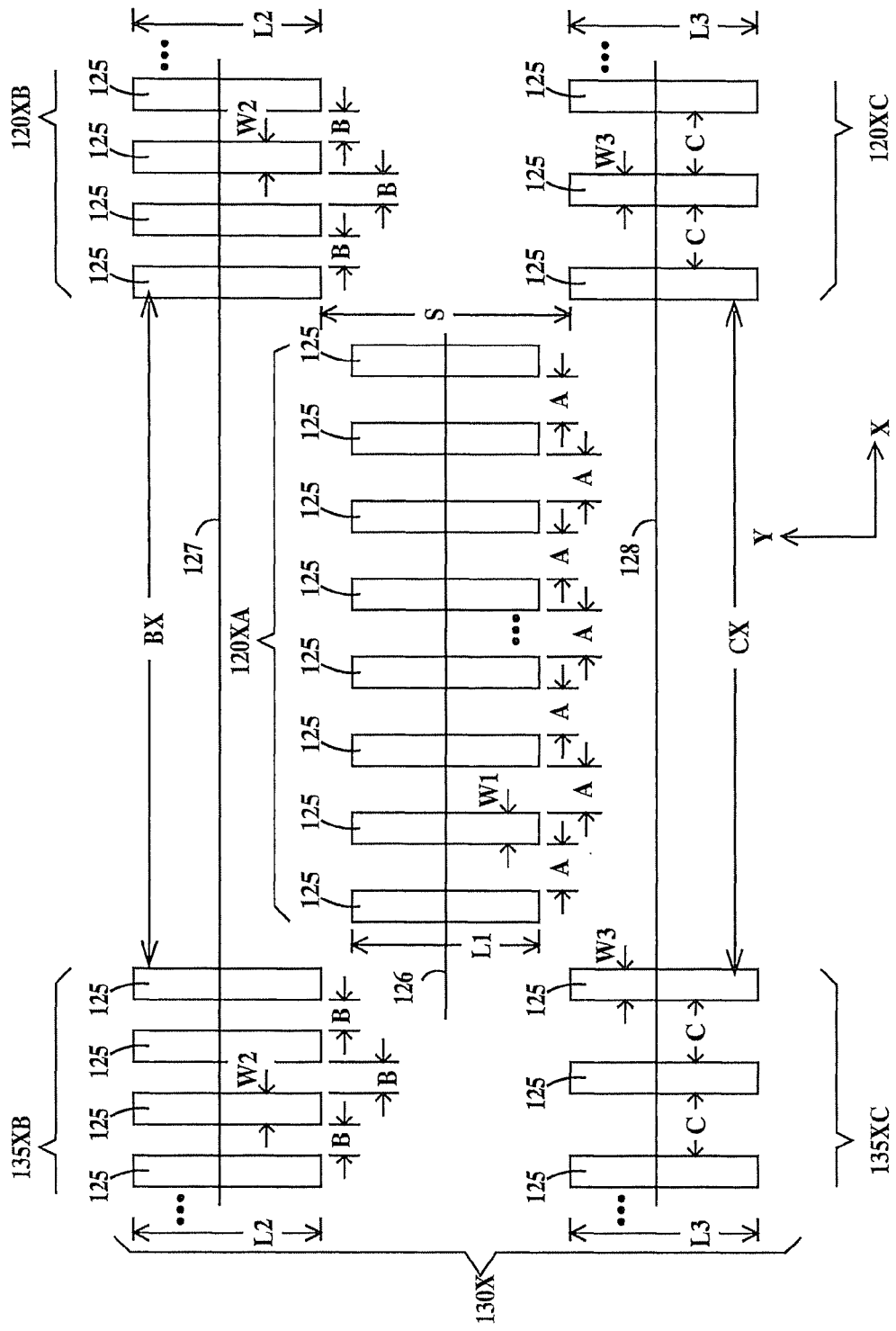
FIG. 4 is a top view of alignment monitor structures according to a second embodiment of the present invention.

FIG. 4 is a top view of alignment monitor structures according to a second embodiment of the present invention. In FIG. 4 a first set of diffraction mirror arrays 130X is similar to first set of diffraction mirror arrays 120X of FIG. 3 except for added fourth and fifth diffraction mirror arrays 135XB and 135XC. Except for location, fourth and fifth diffraction mirror arrays 135XB and 135XC are similar (in one example, identical) to respective second and third diffraction mirror arrays 120XB and 120XC. Fourth and fifth diffraction mirror arrays 135XB and 135XC are positioned adjacent to an opposite end of the first diffraction mirror array 120X that second and third diffraction mirror arrays 120XB and 120XC are position adjacent to, with second and fourth diffraction mirror arrays 120XB and 135XB having a common longitudinal axis 127 and third and fifth diffraction mirror arrays 120XC and 135XC having a common longitudinal axis 128. To avoid diffracted beams of light from third diffraction mirror array 135XB interfering with diffracted beams of light from first diffraction mirror array 120XB a space BX between the two diffraction mirror arrays should be chosen so BX is equal to K times (B+W2) where K is a positive integer. To avoid diffracted beams of light from fifth diffraction mirror array 135XC interfering with diffracted beams of light from second diffraction mirror array 120XC a space CY between the two diffraction mirror arrays should be chosen so CY is equal to K times (C+W3). As there was a second set of diffraction mirror arrays 120Y corresponding to first set of diffraction mirror arrays 120X there is a second set of diffraction mirror arrays 130Y (not shown) corresponding to first set of diffraction mirror arrays 120X. As is discussed infra, the addition of fourth and fifth sets of diffraction mirror arrays 130XB and 130XC will allow torsional misalignment (mask is misaligned in the theta direction when all three diffraction mirror arrays with spacing A, B and C are exposed).

Figure 5A:
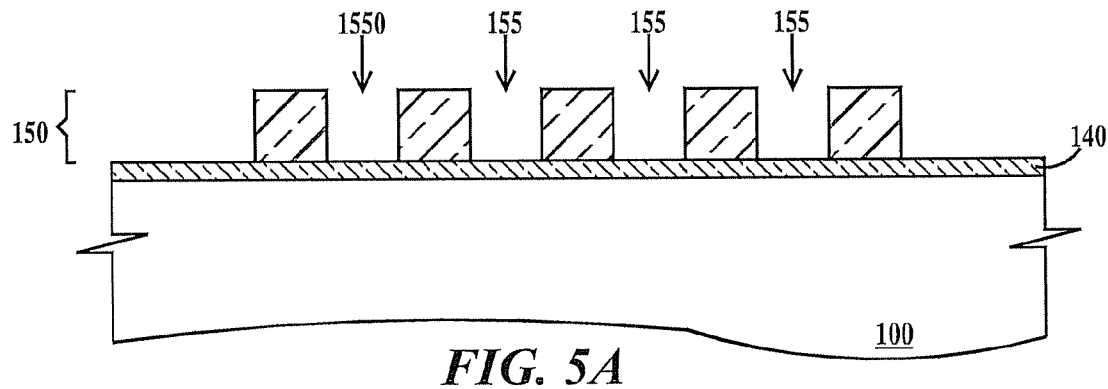
FIGS. 5A through 5D are cross-sectional views illustrating fabrication of alignment monitor structures according to the embodiments of the present invention.

FIGS. 5A through 5D are cross-sectional views illustrating fabrication of alignment monitor structures according to the embodiments of the present invention. In FIGS. 5A through 5D fabrication of first diffraction mirror array 120XA will be exemplary of fabrication of all diffraction mirror arrays of the embodiments of the present invention. In FIG. 5A wafer 100 is a blank wafer having no previous patterns formed into its surface, though there may be dielectric layers, such as pad $SiO_2$ and pad $Si_3N_4$ that are used as a hardmask to define initial patterns in wafer 100. In FIG. 5A, a hardmask layer 140 is formed on a top surface of substrate 100 and a photoresist layer 145 is formed on a top surface of the hardmask layer. Openings 155 are formed in photoresist layer 150, by any number of optical, e-beam or X-ray lithographic processes.

Figure 5B:
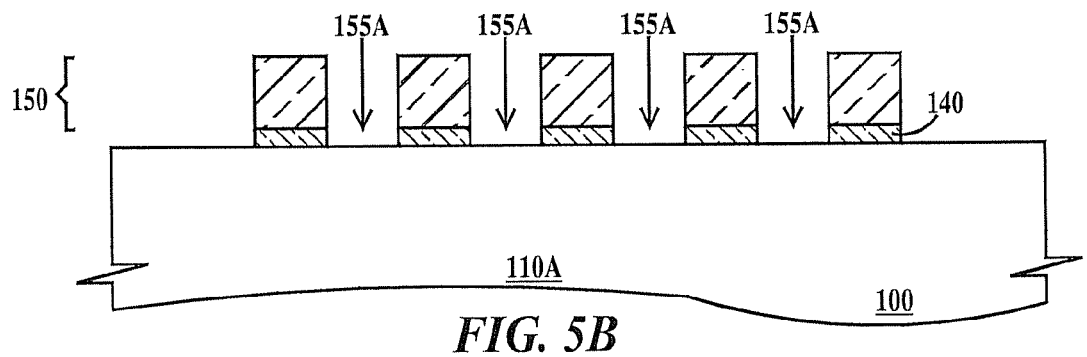

In FIG. 5B, openings 155 are etched (e.g., by reactive ion etch (RIE)) into hardmask layer 140 to form openings 155A in the hardmask layer.

Figure 5C:
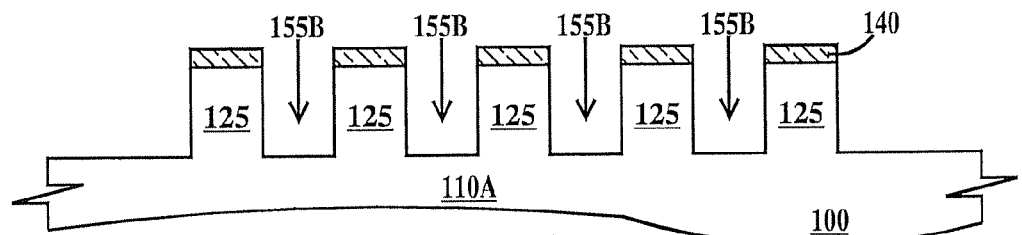

In FIG. 5C, photoresist layer 150 (see FIG. 5B) is removed and grooves 155B are etched (e.g., by RIE) into wafer 100 to define mirrors 125. In one example, steps 5A, 5B and 5C simultaneously form the conventional alignment marks used to align at least the first functional photomask used to fabricate integrated circuit chips 105 (see FIG. 1) to wafer 100. In one example, steps 5A, 5B and 5C are performed after the conventional alignment marks have been formed, mirrors 125 being aligned to those conventional alignment marks.

Figure 5D:
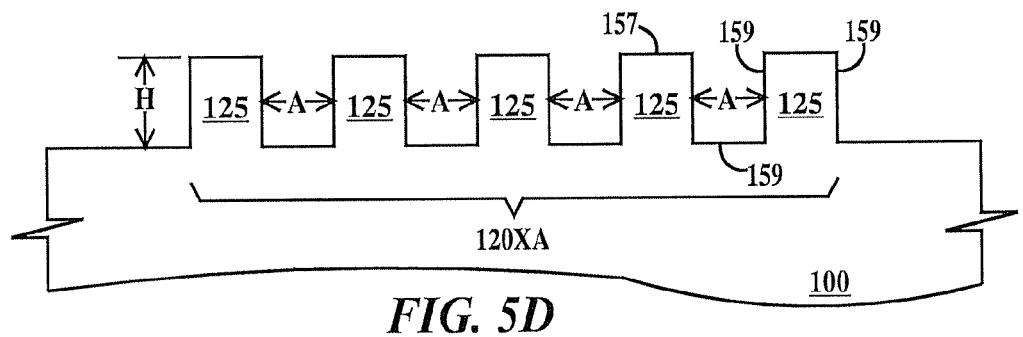

In FIG. 5D, the hardmask layer 140 (see FIG. 5C) is removed to form first diffraction mirror array 120XA. Each mirror 125 has a height H measured perpendicular to the top surface of wafer 100. All mirrors 125 of all other diffraction mirror arrays (i.e., 120XB, 120XC, 120YA, 120YB, 120YC of FIGS. 3 and 135XB and 13XC of FIG. 4) are formed simultaneously with first diffraction mirror array 120XA. Hardmask layer 140 (see FIG. 5C) may be left in other regions of wafer 100, but is removed in the vicinity of all mirrors 125. The value of H is incidental to the operation of the embodiments of the present invention and may be based on the thicknesses of the layers of photolithographic materials (e.g., photoresist layers, antireflective coatings and topcoats) that will be used in the photolithographic processing of wafer 100. However, one must guarantee that H is great enough to present the tops of the diffraction mirrors to incident light (i.e. H must be large enough that all photoresist, antireflective coatings and topcoats sit only in the troughs between diffraction mirrors and not on top of the diffraction mirrors)

In FIGS. 6A through 6C and 7A through 7C it is assumed that antireflective coatings along with photoresist are to be used. The top surfaces 157 of mirrors 125 (see FIG. 5D) are intended to be the primary diffractive surface for normally incident light. Mirrors 125 diffract light more coherently when diffraction from surfaces 158 (see FIG. 5D) between mirrors 125 is prevented or reduced. Because light striking wafer 100 is normal to the top surface of wafer 100, light diffracted off the sidewalls 159 (see FIG. 5D) of mirrors 125 is negligible, particularly if efforts are made to keep sidewalls 159 perpendicular to the top surface of wafer 100 or even taper inward from top surface 157 to surface 159.

Figure 6A:
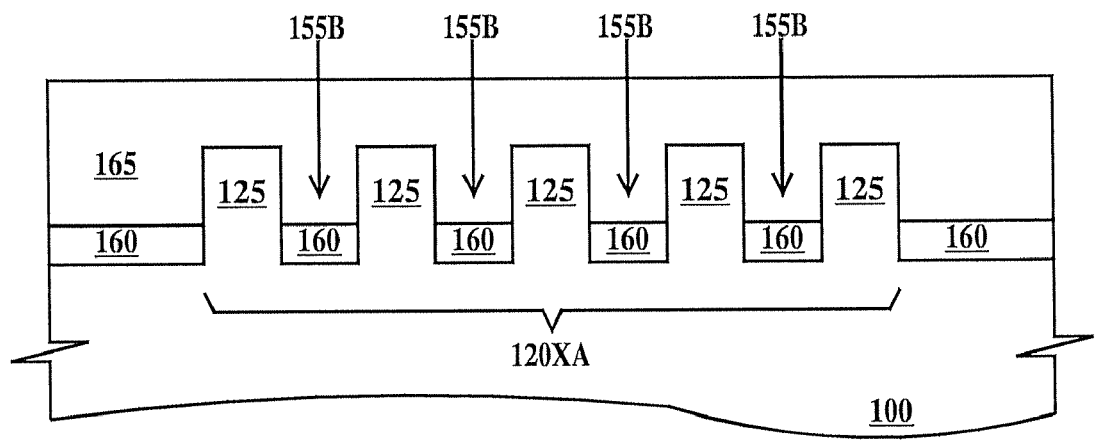
FIGS. 6A through 6C are cross-sectional views illustrating a first method of preparing of the region of wafer 100 containing alignment structures according to the embodiments of the present invention for use in a photolithographic system.
Figure 6B:
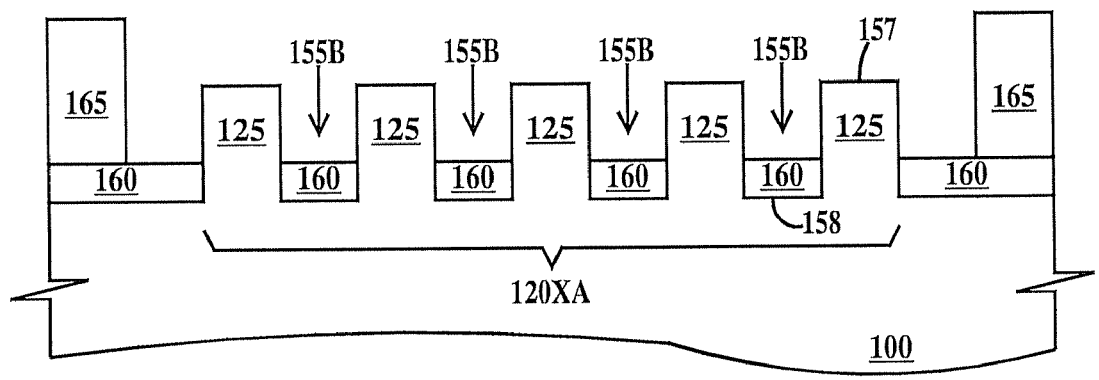
Figure 6C:
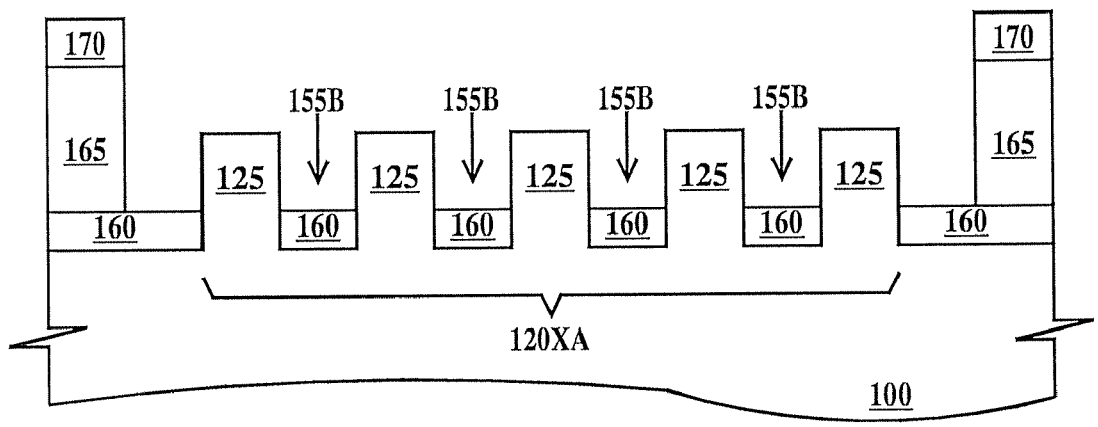

FIGS. 6A through 6C are cross-sectional views illustrating a first method of preparing of the region of wafer 100 containing alignment structures according to the embodiments of the present invention for use in a photolithographic system. In FIGS. 6A through 6C preparation of first diffraction mirror array 120XA will be exemplary of preparation of all diffraction mirror arrays of the embodiments of the present invention. In FIG. 6A, an antireflective coating (ARC) 160 has been formed in the bottom of grooves 155B between mirrors 125 and a photoresist layer 165 formed over the antireflective coating and mirrors 125. In FIG. 6A, ARC 160 does not completely fill grooves 155B.

In FIG. 6B, photoresist layer 165 is removed from over mirrors 125 exposing top surfaces 157 of mirrors 125 while ARC 160 reduces or eliminates diffraction from bottom surfaces 158 of grooves 155B. In FIG. 6B, ARC 160 advantageously does not cover top surfaces 157 of mirrors 125.

FIG. 6C is similar to FIG. 6B, except a top antireflective coating (TARC) 170 is to also be used in the photolithographic process and TARC 170 is removed from over mirrors 125.

Figure 7A:
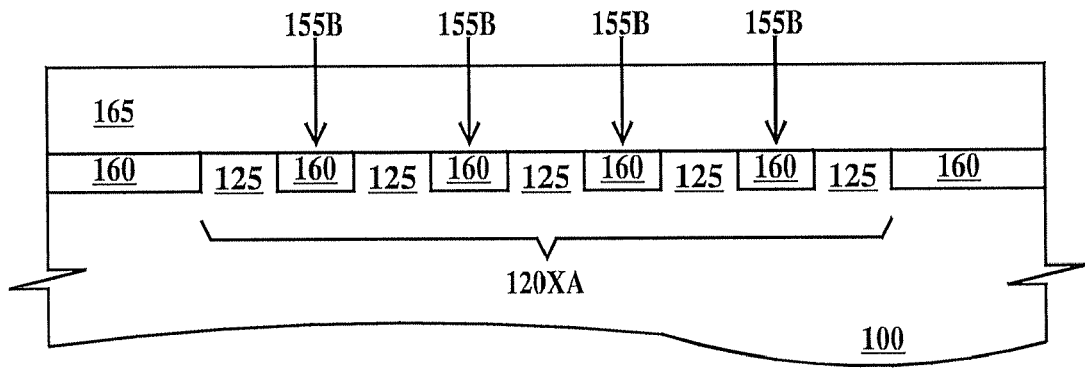
FIGS. 7A through 7C are cross-sectional views illustrating a first method of preparing of the region of wafer 100 containing alignment structures according to the embodiments of the present invention for use in a photolithographic system.
Figure 7B:
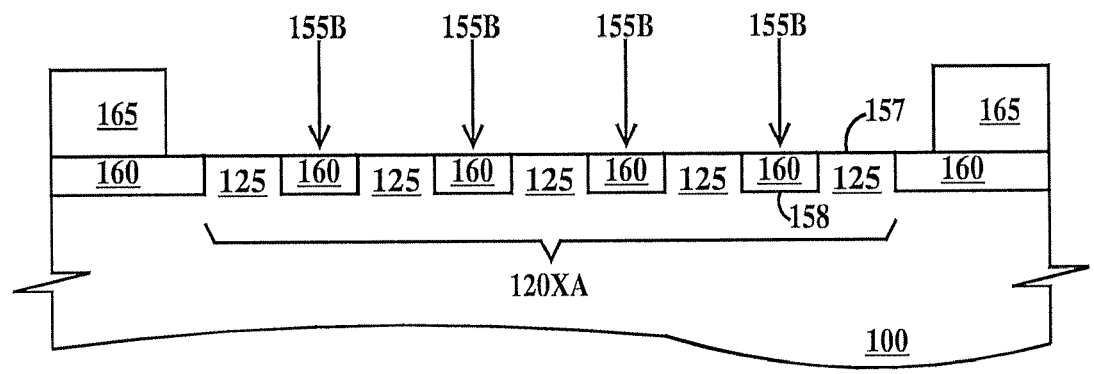
Figure 7C:
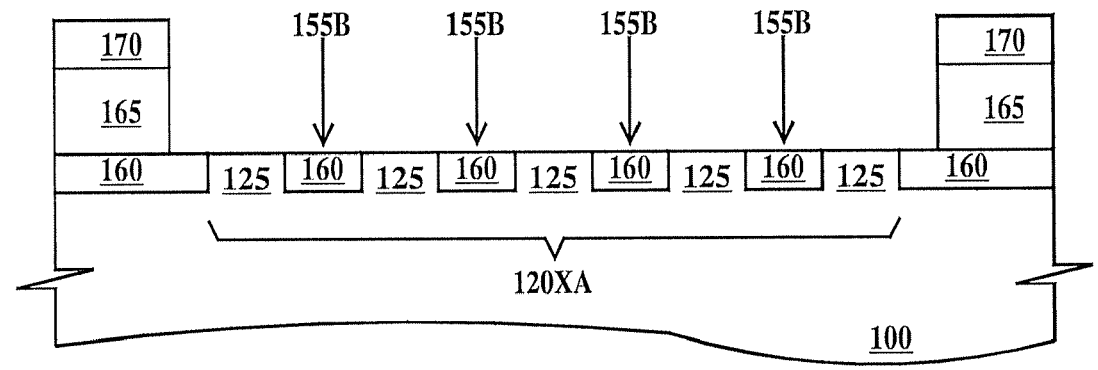

FIGS. 7A through 7C are cross-sectional views illustrating a first method of preparing of the region of wafer 100 containing alignment structures according to the embodiments of the present invention for use in a photolithographic system. In FIGS. 7A through 7C preparation of first diffraction mirror array 120XA will be exemplary of preparation of all diffraction mirror arrays of the embodiments of the present invention. In FIG. 7A, ARC 160 fills grooves 155B between mirrors 125 and a photoresist layer 165 is formed over the ARC.

In FIG. 7B, photoresist layer 165 is removed from over mirrors 125 exposing top surfaces 157 of mirrors 125 while ARC 160 reduces or eliminates diffraction from bottom surfaces 158 of grooves 155B. In FIG. 7B, ARC 160 advantageously does not cover top surfaces 157 of mirrors 125.

FIG. 7C is similar to FIG. 7B, except a top antireflective coating (TARC) 170 is to also be used in the photolithographic process and TARC 170 is removed from over mirrors 125.

FIG. 8 is an isometric view of the operation of alignment monitor structures according to the embodiments of the present invention when the photomask and wafer are aligned. In FIG. 8, light (e.g., UV radiation) 175 from a source 180 passes through a clear region 185 of a photomask 190, then through a lens 195 to illuminate a region 200 (dashed lines) of wafer 100 (specifically a region of kerf 110A). Clear region 185 is surrounded by an opaque region and the clear region is wide enough to completely expose all of the mirrors in the first diffraction mirror array 120XA but not wide enough to expose any portions of second and third diffraction mirror arrays 120XB and 120XC. Clear region 185 long enough to completely expose all the mirrors first diffraction mirror array 120XA and either second or third diffraction mirror arrays 120XB and 120XC or the space between second and third diffraction mirror arrays 120XB and 120XC. With photomask 190 aligned correctly to wafer 100, light 175 strikes first diffraction mirror array 120XA, but not second or third diffraction mirror arrays 120XB and 120XC and a beam 205 is diffracted at an angle AA relative to a longitudinal axis 210 of first diffraction mirror array 120XA.

Figure 9:
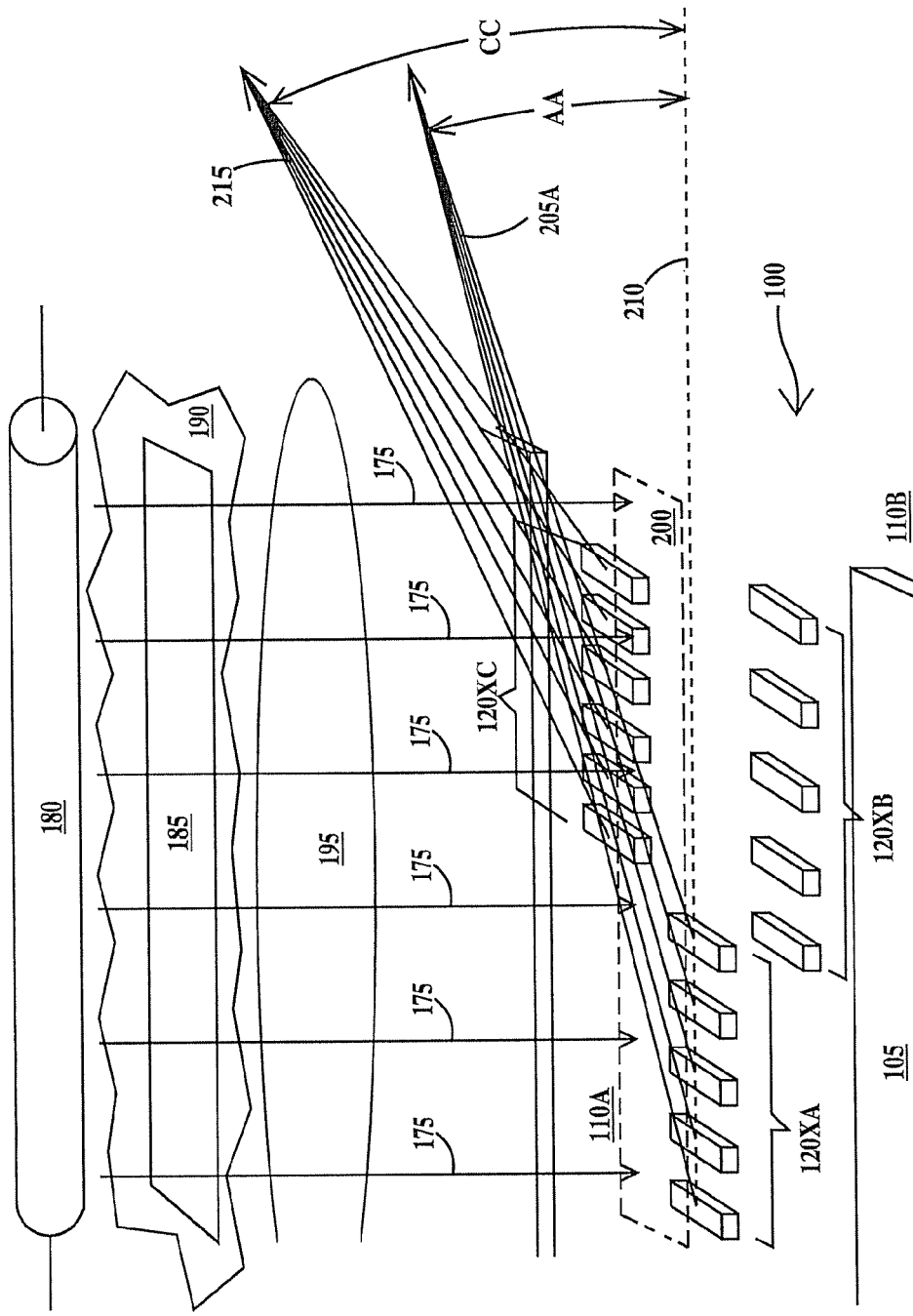
FIG. 9 is an isometric view of the operation of alignment monitor structures according to the embodiments of the present invention when the photomask and wafer are not aligned.

FIG. 9 is an isometric view of the operation of alignment monitor structures according to the embodiments of the present invention when the photomask and wafer are not aligned. In FIG. 9, photomask 190 is not correctly aligned to wafer 100 and illuminated area now strikes third diffraction mirror array 120XC (as well as first diffraction mirror array 120XA) and a first beam 205A is diffracted at angle AA and a second beam 215 is diffracted at an angle CC relative to longitudinal axis 210 of first diffraction mirror array 120XA. Angle CC is greater than angle AA because, in the continuing example of FIG. 3, the spacing of the mirrors of third diffraction mirror array 120XC is less than the spacing of the mirrors of third diffraction mirror array 120XC. See Table I infra. Further, the intensity of beam 205A is reduced from that of beam 205 of FIG. 8 because there is less light be diffracted from first diffraction mirror array 120XA.

The angle of diffraction of a beam striking a diffraction mirror at 90° (normal incidence) to the top surface of the mirror is a function of the groove size and the wafer length of the incident light and is given by equation 1:

$$d(\sin \theta_m(\lambda) + \sin \theta_i) = m\lambda \quad (1)$$

where d=groove period and λ=the incident wavelength and $\theta_m(\lambda)$ is the diffracted angle (m is the diffraction order, in the present invention m=1). The groove period is A, B and C of FIGS. 3 and 4.

Table I gives the diffracted angle as a function of groove period for 157 nm light, assuming incident light is normal to the diffraction mirror array.

TABLE I

| Groove Period (nm) | Angle of Diffraction for m = 1 (degrees) |
|---|---|
| 157 | 90.00 |
| 162 | 75.72 |
| 167 | 70.07 |
| 172 | 65.89 |
| 177 | 62.49 |
| 187 | 57.09 |
| 197 | 52.84 |
| 217 | 46.34 |
| 237 | 41.48 |
| 257 | 37.65 |
| 277 | 34.52 |
| 297 | 31.91 |
| 314 | 30.00 |

Table II illustrates the possible diffracted beams from sets of diffraction memory arrays according to the embodiments of the present invention. The first three cases are responses from set of diffraction mirror arrays 120X of FIG. 3 and set of diffraction mirror arrays 130X of FIG. 4. The fourth case is only applicable to set of diffraction mirror arrays 130X of FIG. 4.

TABLE II

| Case | IF | THEN | Light Diffracted |
|---|---|---|---|
| 1 | Mask and Lens Aligned | Light Incident Only on 120XA or 130XC | Only at Angle AA |
| 2 | Mask and Lens Misaligned +Y Direction | Light Incident on 120XA and 120XC or 130XA and 130XC | At Angle AA and at Angle CC Light AA weaker than Case 1 |
| 3 | Mask and Lens Misaligned −Y Direction | Light Incident on 120XA and 120XB or 130XA and 130XB | At Angle AA and at Angle BB Light AA weaker than Case 1 |
| 4 | Mask and Lens Rotated | Light Incident on 130XA, 130XB and 120XB | At Angles AA, BB and CC Light AA weaker than Case 1 Light BB and CC weaker than cases 2 and 3 |

Two methods of determining the groove size of the diffraction mirror arrays are possible. The first is by calculation and was described supra. The first method does not give the number of individual mirrors required for each diffraction mirror array, does not take into account any interference patterns, nor does it inform the size of photosensor needed. The second method allows determining all three.

For the second method, first, fabricate a wafer having mirror periodicity in increments from 1λ to 2λ where λ is the wavelength of light to be used in the photolithography system (e.g., if λ=157 nm, make mirror arrays having mirrors spaced from 157 nm to 314 nm in 5 nm increments (i.e., groove size of 5 nm)). For each spacing 157 nm, 162 nm, 167 nm through 314 nm make arrays with 1E3 mirrors, 1E4 mirrors, 1E5 mirror and 1E6 mirrors. This gives 52 sets of mirrors in the present example.

Second, fabricate a photomask that can expose each set of mirrors individually or in groups of two and three to incident light. This mask is essentially opaque except for clear slots that will allow light to pass through the photomask and strike only selected mirror arrays on the wafer.

Third, treat the wafer with an ARC and optionally photoresist as described supra, so the ARC covers the grooves and ARC and photoresist do not cover the top surfaces of the diffraction mirrors.

Fourth, expose each (e.g. all 52) diffraction mirror array individually and measure the angle of diffraction and intensity of the diffracted beam.

Fifth, expose combinations of two diffraction mirror arrays of different groove size simultaneously and measure the angles of diffraction and intensities of the diffracted beams. The combinations include combinations of diffraction mirror arrays having the same and different numbers of diffraction mirrors (e.g. 1E4, 1E5, 1E6).

Sixth, expose combinations of three diffraction mirror arrays of different groove size simultaneously and measure the angles of diffraction and intensities of the diffracted beams. The combinations include combinations of diffraction mirror arrays having different numbers of diffraction mirrors (e.g. 1E4, 1E5, 1E6).

Seventh, simulate a production setup by selecting groove spacings and numbers of mirrors based on the results of the tests performed in the third, fourth and fifth step for the A, B, and C mirrors spacing of the first second and third diffraction mirror arrays.

Eighth, fabricate a wafer having the selected diffraction mirror arrays arranged as illustrated in FIGS. 2, 3 and 4 and described supra.

Ninth, create a mask having a clear region surrounded by opaque regions that can expose the A spaced mirrors (see FIGS. 3, 5, 8 and 9 and discussion supra) about completely without exposing the B and C spaced mirrors.

Tenth, in a step and expose or step and scan photolithography tool, align the longitudinal axis of the clear opening the photomask and the longitudinal axis of the first diffraction mirror array in the same direction so only the first diffraction mirror array is exposed to light passing through the opening. Then step the wafer to cause overlap of the beam projected through the clear region with the first and second and then first and third diffraction mirror arrays to simulate misalignment in a production wafer and measure the intensity and angles of the diffracted beams. The stepping may be repeated at different rotational angles of longitudinal axis of the clear opening in the photomask relative to the longitudinal axis of the first.

Eleventh, repeat the eighth, ninth and tenth steps until satisfactory results are obtained.

Twelfth, determine the locations and physical dimensions of photo detectors required to detect and measure the intensity of light refracted from the diffraction mirror arrays in an actual production photolithography tool. Examples of photolithography tool are illustrated in FIGS. 10 and 11 and described infra.

Figure 10:
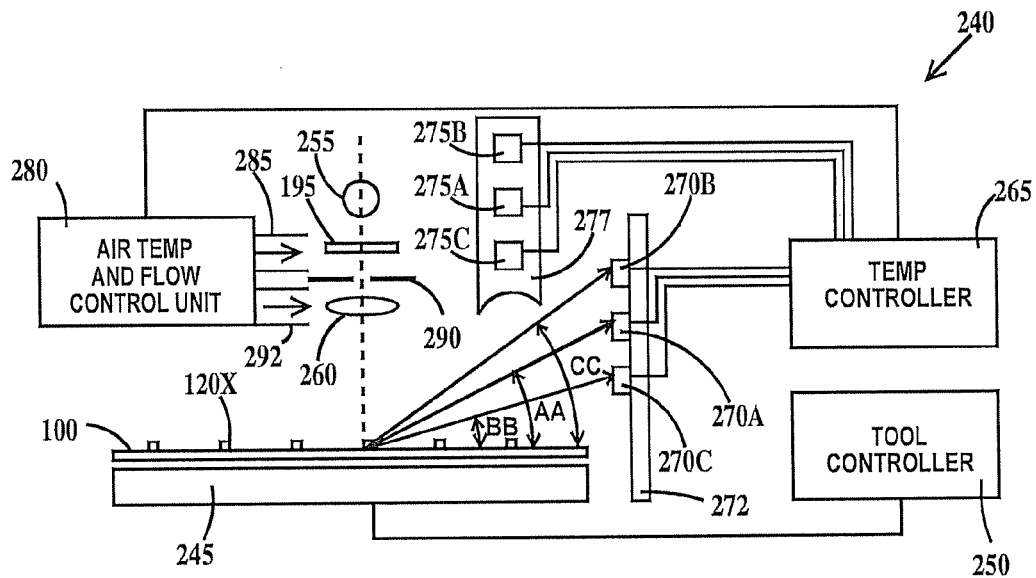
FIG. 10 is schematic diagram of a first optical photolithography system according to embodiments of the present invention.

FIG. 10 is schematic diagram of a first optical photolithography tool according to embodiments of the present invention. In FIG. 10, a step and expose photolithography tool 240 includes a X-Y-θ stage 245, a tool controller 250, a light source 255, a lens 260, a temperature controller 265, Y-alignment photo detectors 270A, 270B and 270C on a mounting bracket 272, X-alignment photo detectors 275A, 275B and 275C on a mounting bracket 277 and an air temperature and flow control unit 280 having means 285 for directing filtered air (or other filtered gas) at a determined temperature onto photomask 195 at a determined flow rate. Y-alignment photo detectors 270A, 270B and 270C are positioned detect light diffracted perpendicular to light detected by X-alignment photo detectors 275A, 275B and 275C. In one example, brackets 272 and 277 and the top surface of stage 245 are mutually orthogonal. Brackets 272 and 277 may be tilted toward stage 245 or may be curved so the distance traveled by the diffracted light from the different mirror arrays to the corresponding photo detectors is about the same.

In operation, stage 245 steps wafer 100 under lenses 270. Based on the intensity of the signals from photo detectors 270A, 270B, 270C, 275A, 275B and 275C, temperature controller 265 directs air temperature and flow control unit 280 to blow filtered air (or other filtered gas) at a determined temperature and flow rate over photomask 195 until signals from photo detectors 270A, 270B, 270C, 275A, 275B and 275C reach predetermined values. At this point the photomask is in thermal equilibrium. First set of diffraction mirror arrays 120X and beams refracted at angles AA, BB and CC are illustrated in FIG. 10 as an aid to understand the operation of photolithography tool 240. Then mask 195 can be aligned to wafer 100 using conventional photomask to wafer alignment means under the control of tool controller 250. In a step and expose system, wafer 100 is exposed and then stage 245 steps wafer 100 to a new location and the process repeats. Moveable slit 290 is not present in a step and expose photolithography tool (other non-scannable slits may be present). In a step and scan system, moveable slit 290 is positioned between photomask 195 and lens 260 is scanned across photomask 195 to expose wafer 100 to less than whole portions of photomask 195 at any given instant of time. Then stage 245 steps wafer 100 to a new location and the process repeats. Optionally tool 240 may be provided with a means 292 for directing air over lens 260 at a predetermined temperature and predetermined flow rate until signals from photo detectors 270A, 270B, 270C, 275A, 275B and 275C reach predetermined values. The temperature of photomask 195 and lens 260 may be controlled to the same temperature or different temperatures.

Figure 11:
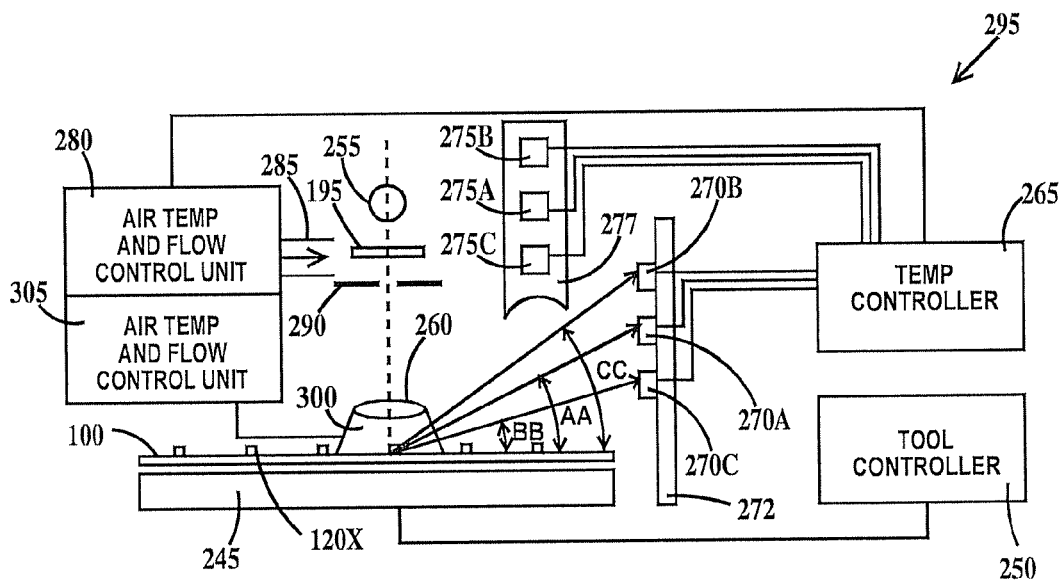
FIG. 11 is schematic diagram of a second optical photolithography system according to embodiments of the present invention.

FIG. 11 is a schematic diagram of a second optical photolithography system according to embodiments of the present invention. In FIG. 11 an immersion photolithography tool 295 is similar to photolithography too 240 of FIG. 10, except an immersion head 300 contains lens 260 and an immersion fluid (e.g., water) fills the space between the lens and the top surface of wafer 100 and a fluid temperature and flow control unit 305 for control of the immersion fluid temperature (and thus lens 260 temperature) is provided. Immersion photolithography tool may be a step and expose or a step and scan tool. The temperature of photomask 195 and lens 260 may be controlled to the same temperature or different temperatures.

In FIGS. 10 and 11, photomask 195 may be comprised, for example, $SiO_2$ (not transmissive below 193 nm, coefficient of thermal expansion of 0.5 ppm/° C.), $SiFO_2$ (not transmissive below 157 nm) or $CaF_2$ (transmissive below 157 nm, coefficient of thermal expansion of 14 ppm/° C.). In one example, lens 260 and the substrate of photomask 195 are comprised of the same material (e.g., both are $SiO_2$, $SiFO_2$ or $CaF_2$). While useful when the photomask and/or lens comprise $SiO_2$, the embodiments of the present invention are of particular usefulness when the lens and/or photomask comprise materials having high (e.g., greater than about 0.5 ppm/° C.) coefficients of thermal expansion as the amount of expansion of the mask and/or lens can be controlled to same value regardless of room ambient temperature.

After the steps illustrated in FIGS. 6A through 6C or 7A through 7C, photomask or photomask and lens temperatures are adjusted as illustrated in FIGS. 8, 9, 10 and 11 and described infra, followed by exposure of the photoresist layer to actinic radiation through a patterned photomask, developing the exposed photoresist to define a pattern in the photoresist corresponding to a fabrication level of an integrated circuit chip, etching/or ion implanting the substrate followed by, and resist and ARC removal. The ARC would be removed by the etching where not protected by photoresist and ion implantation may be through ARC or the ARC may be removed by etching ARC selective to photoresist.

Thus the present invention provides a method of monitoring and controlling photomask to wafer alignments compatible with sub-193 nm photolithography (e.g., 157 nm and lower). However, the embodiments of the present invention may be used with wavelengths of 193 or lower.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while the present invention is directed to sub-193 nm photolithography, the invention may be practiced with supra-193 nm photolithography. Additionally the embodiments of the present invention may be practiced on substrates having a different geometry than wafers, such as rectangular substrates or wafers comprising other semiconductor materials such as germanium, sapphire and gallium. Therefore, it is intended that the following claims cover all such modifications and changes as fall within the true spirit and scope of the invention.

What is claimed is:

1. A system for aligning a semiconductor substrate to a photomask, comprising:
    an X-Y-θ stage configured to hold said semiconductor substrate;
    a light source;
    a lens;
    a mask holder configured to hold said photomask between said light source and lens;
    means for aligning alignment targets on said substrate to alignment marks on said photomask;
    an array of photo detectors positioned to measure intensities of light diffracted at least three different angles from diffraction mirrors on said substrate; and
    means for adjusting alignment of said alignment targets on said photomask to said alignment targets on said photomask said substrate based on said intensities of light.

2. The system of claim 1, further including:
    a moveable slit between said mask holder and said lens.

3. The system of claim 1 further including:
    a fluid filled immersion head between said lens and a top surface of said substrate.

4. The system of claim 3, wherein said means for adjusting said alignment comprises a sub-system configured to adjust a temperature of said immersion fluid based on said intensities of light.

5. The system of claim 1, wherein said means for adjusting said alignment comprises a sub-system configured to direct temperature controlled gas over said photomask.

6. The system of claim 1, further including:
    an additional array of photo detectors positioned to measure intensities of light diffracted at least three additional different angles from additional diffraction mirrors on said substrate, an angle measured between said array of photo detectors and said additional array of photo detectors from a reference point being 90°, said reference point defined by an intersection of a first line between said diffraction mirrors between said array of photo detectors and a second line between said additional diffraction mirrors to said additional array of photo detectors.

7. The system of said claim 1, wherein (i) both said lens and a substrate of said photomask comprise $SiFO_2$ or (ii) both said lens and said substrate of said photomask comprise $CaF_2$.

* * * * *